United States Patent [19]
Lee

[11] Patent Number: 6,078,546
[45] Date of Patent: Jun. 20, 2000

[54] SYNCHRONOUS SEMICONDUCTOR MEMORY DEVICE WITH DOUBLE DATA RATE SCHEME

[75] Inventor: Jung-Bae Lee, Kyunggi-do, Rep. of Korea

[73] Assignee: Samsung Electronics Co., Ltd., Suwon, Rep. of Korea

[21] Appl. No.: 09/044,391

[22] Filed: Mar. 18, 1998

[30] Foreign Application Priority Data

Mar. 18, 1997 [KR] Rep. of Korea ................... 97-9191

[51] Int. Cl.[7] ................................................ G11C 8/00
[52] U.S. Cl. ......................... 365/233; 365/194; 365/241; 365/230.04
[58] Field of Search ............................. 365/233, 230.08, 365/230.06, 189.05, 194, 191, 241, 230.04

[56] References Cited

U.S. PATENT DOCUMENTS 5,726,950 3/1998 Okamoto et al. ..................... 365/233
5,796,675 8/1998 Jang ................................ 365/230.08

*Primary Examiner*—David Nelms
*Assistant Examiner*—Thong Le
*Attorney, Agent, or Firm*—Marger Johnson & McCollom, P.C.

[57] ABSTRACT

Disclosed is a synchronous semiconductor device having a double data rate input circuit which allows data to be written in the device in response to a clock signal and a data strobe signal. The input circuit stores a pair of data which is synchronized with either the clock signal or the data strobe signal, thereby processing data at high speed. In case the data strobe is used, data setup and hold window margin is improved.

16 Claims, 9 Drawing Sheets

SYNCHRONOUS SEMICONDUCTOR MEMORY DEVICE WITH DOUBLE DATA RATE SCHEME

FIELD OF THE INVENTION

The present invention relates to a synchronous semiconductor memory device that operates in synchronization with an external clock signal. More particularly, the present invention relates to an input circuit for a synchronous semiconductor memory device for writing data into a memory cell in synchronization with each edge of either an externally applied clock signal or a data strobe signal and a method for writing data into the same.

BACKGROUND OF THE INVENTION

FIG. 1 is a partial block diagram of a conventional synchronous semiconductor memory including circuits related to a data input device. FIG. 2 is a circuit diagram of a data register for the memory device shown in FIG. 1. FIG. 3 is a timing diagram of a data writing operation for the memory device shown in FIG. 1.

Referring to FIG. 1, a data input circuit 110 includes a data input buffer 100, an edge detector 101, a data register 102, and a write driver 103. The data register 102 includes a pair of latches L1 and L2 respectively controlled by a clock signal φCLK and a complementary clock signal $\overline{\phi CLK}$ as best shown in FIG. 21. Data $DIN_M$ (where M is equal to 0, 1, 3, ... i) is input externally to the data buffer 100. The data buffer 100 provides the buffered data signal $DIND_M$ to the data registers to meet the requirement of set-up and hold times on the basis of a rising edge of the clock signal φCLK generated from the edge detector 101. The data string $DIND_M$ generated from the data input buffer 100 is sampled by the latches L1 and L2. The latches L1 and L2 are synchronized with the clock signals $\overline{\phi CLK}$ and φCLK, respectively, and then applied to the write driver 103. The externally applied address and write commands are decoded by an ADD&COM buffer 104, an ADD&COM decoder 105, and a timing control circuit 106. The write driver 103 activates the decoded signals. The write driver 103 delivers the data string $DIND_M$ from the data register 102 to a data line. Also, a column decoder 107 generates a column selection signal CSL used to select a column of the memory array corresponding to an input address responsive to the timing control circuit 106. Thus, during a data writing operation, one data signal is written into the memory device every clock cycle.

However, recently developed high-speed processors and multimedia computer systems require memory devices having higher and higher bandwidths. A technique has been developed to address these needs. The technique involves reading or writing data from or into memory cell array, respectively, by using both the rising and falling edges of the clock signal. This technique is frequently called Double Data Rate (DDR).

In addition, there is a technique for providing a data strobe signal together with a data signal transferred to meet the requirement of set-up time and hold time of its destination. This transfer of data and strobe signals can easily be achieved by toggling a dummy data signal. By doing so, during a data writing operation, two or four data signals may be written into respective memory cell arrays every clock cycle during a writing operation according to a variety of writing methods.

SUMMARY OF THE INVENTION

It is therefore an object of the invention to provide a synchronous semiconductor memory device wherein a data string can be written into a memory cell in synchronization with edges of a clock signal or a data strobe signal during a data write operation thereof.

According to an aspect of the present invention, a data input circuit for a synchronous semiconductor memory device having a memory cell array, comprises a first edge detector for generating a first internal strobe signal and a second internal strobe signal responsive to an external data strobe signal; a second edge detector for generating a first internal clock signal and a second internal clock signal responsive to an external clock signal; a selector for selecting either the first and second internal strobe signals or the first and second internal clock signals; a register circuit having first and second registers, the first register for storing odd-numbered data of an externally applied data string responsive to the selected signals and the second register for storing even-numbered data of the data string responsive to the selected signals; a delay circuit for generating a delayed clock signal by delaying one of the internal clock signals; and a data write driver having first and second write drivers, the first write driver for writing the odd-numbered data from the first register into the memory cell array responsive to the delayed clock signal and the second write driver for writing the even-numbered data from the second register into the memory cell array responsive to the delayed clock signal.

According to another aspect of the present invention, a data input circuit for a synchronous semiconductor memory device having a memory cell array comprises an edge detector for generating a first and a second internal clock signal responsive to an external clock signal; a register circuit having first and second registers, the first register for storing odd-numbered data of an externally applied data string responsive to the first and second internal clock signals and the second register for storing even-numbered data of the externally applied data string responsive to the second internal clock signal; a delay circuit for generating a delayed clock signal by delaying one of the internal clock signals; and a data write driver having first and second write drivers, the first write driver for writing the odd-numbered data from the first register into the memory cell array responsive to the delayed clock signal and the second write driver for writing the even-numbered data from the second register into the memory cell array responsive to the delayed clock signal.

According to a further aspect of the present invention, a data input circuit for a synchronous semiconductor memory device having a memory cell array comprises a first edge detector for generating a first internal strobe signal responsive to a first edge of an externally applied data strobe signal and generating a second internal strobe signal responsive to a second edge of the externally applied data strobe signal; a register circuit having first and second registers, the first register for storing odd-numbered data of an externally applied data string responsive to the first and second internal strobe signals and the second register for storing even-numbered data of the externally applied data string responsive to the second internal strobe signal; a second edge detector for generating an internal clock signal responsive to an edge of an externally applied clock signal; a delay circuit for generating a delayed clock signal by delaying one of the internal clock signals; and a data write driver having first and second write drivers, the first write driver for writing the odd-numbered data from the first register into the memory cell array responsive to the delayed clock signal and the second write driver for writing the even-numbered data from the second register into the memory cell array responsive to the delayed clock signal.

According to a further aspect of the present invention, a method for writing data into a semiconductor memory device having a memory cell array, comprises receiving an external clock signal and an external data string; generating a first and a second internal clock signal responsive to the external clock signal; storing odd-numbered data from the external data string into a first register responsive to the first and second internal clock signals; storing even data-numbered from the external data string into a second register responsive to the second internal clock signal; delaying one of the internal clock signals; writing the odd-numbered data from the first register to the memory cell responsive to the delayed first internal clock signal; and writing the even-numbered data from the first register to the memory cell responsive to the delayed first internal clock signal.

The method includes generating the first and second internal clock signals includes generating the first and second internal clock signals responsive to a first and a second edge of the external clock signal, respectively. The method further includes receiving an external data strobe signal; generating a first and a second internal data strobe signal responsive to the external data strobe signal; selecting either the first and second internal clock signals or the first and second internal data strobe signals responsive to a selection control signal; wherein storing odd-numbered data from the external data string into a first register responsive to the first internal clock signal is replaced with storing odd-numbered data from the external data string into a first register responsive to one of the selected signals; and wherein storing even-numbered data from the external data string into a second register responsive to the second internal clock signal is replaced with storing even-numbered data from the external data string into a second register responsive to another of the selected signals.

BRIEF DESCRIPTION OF THE DRAWINGS

The foregoing and other objects, features, and advantages of the invention will become more readily apparent from the following detailed description of a preferred embodiment that proceeds with reference to the following drawings.

DETAILED DESCRIPTION OF THE PREFERRED EMBODIMENTS

First Embodiment

Figure 1:
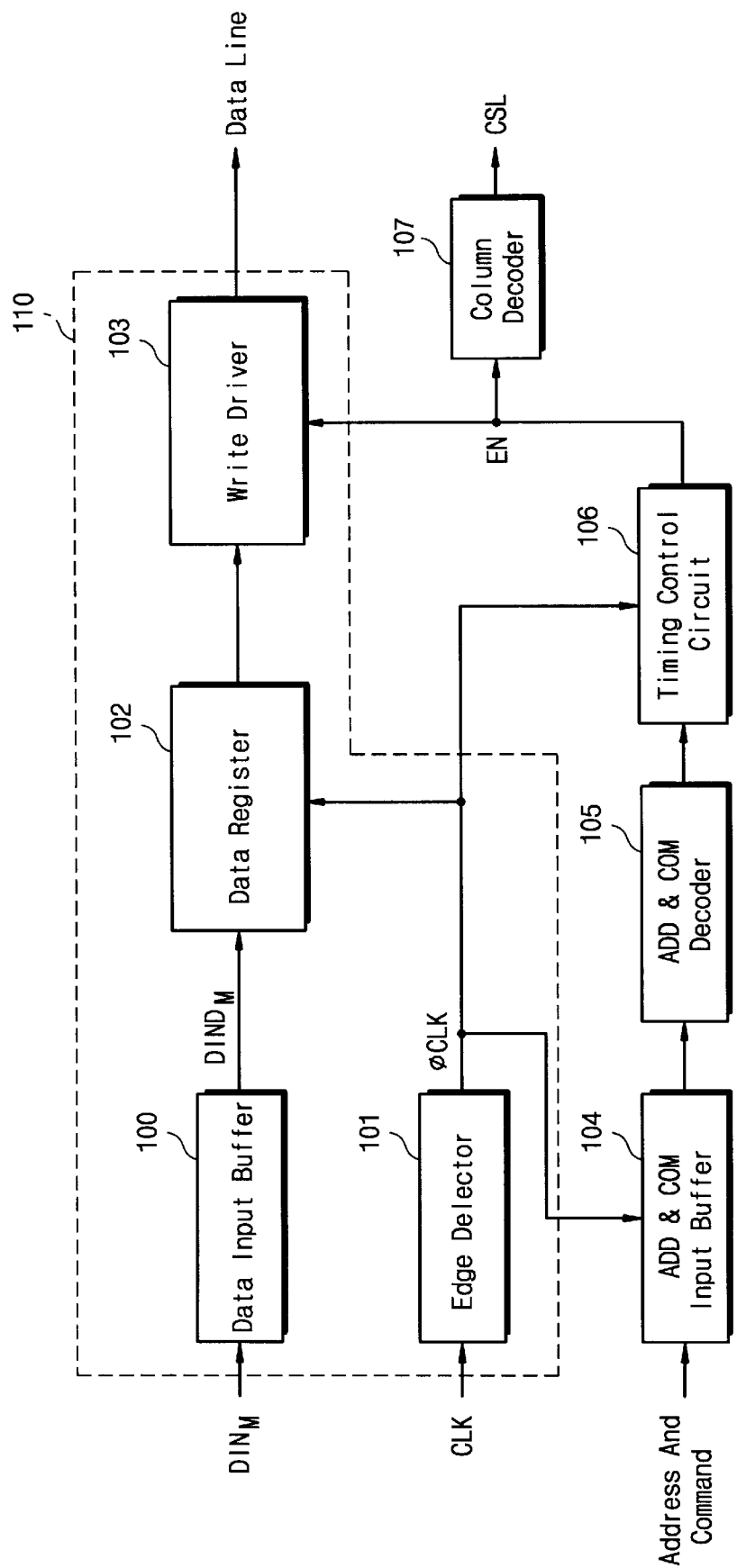
FIG. 1 is a block diagram of a conventional synchronous semiconductor memory device.
Figure 2:
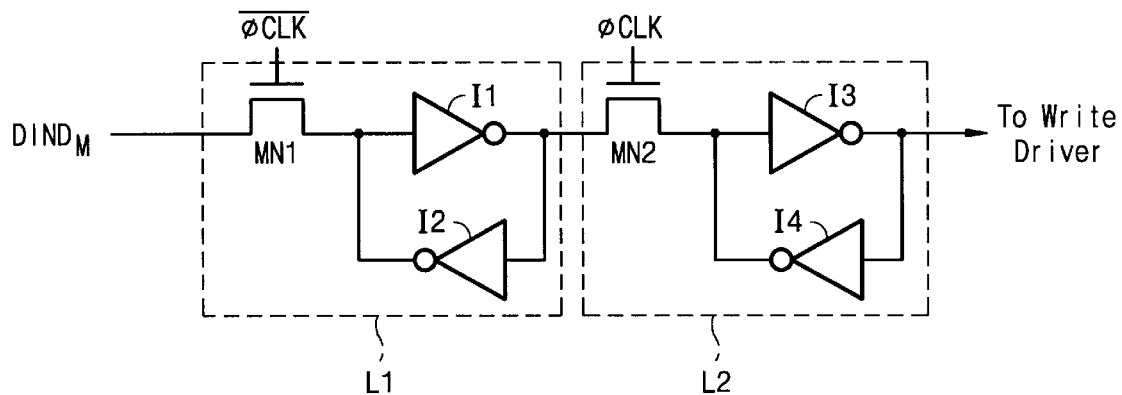
FIG. 2 is a detailed circuit diagram of a data register for the memory device shown in FIG. 1.
Figure 3:
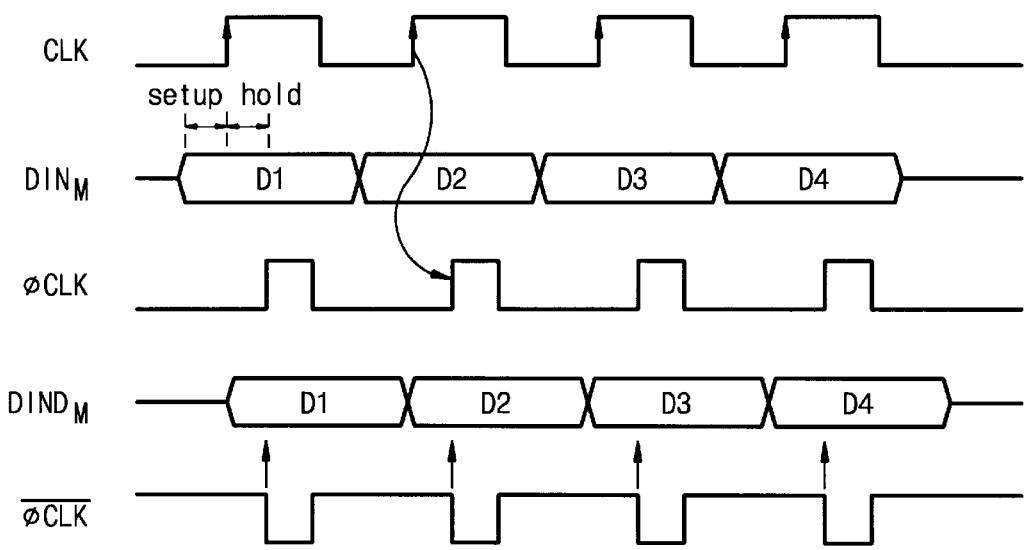
FIG. 3 is a timing diagram of a data writing operation for the memory device shown in FIG. 1.
Figure 4:
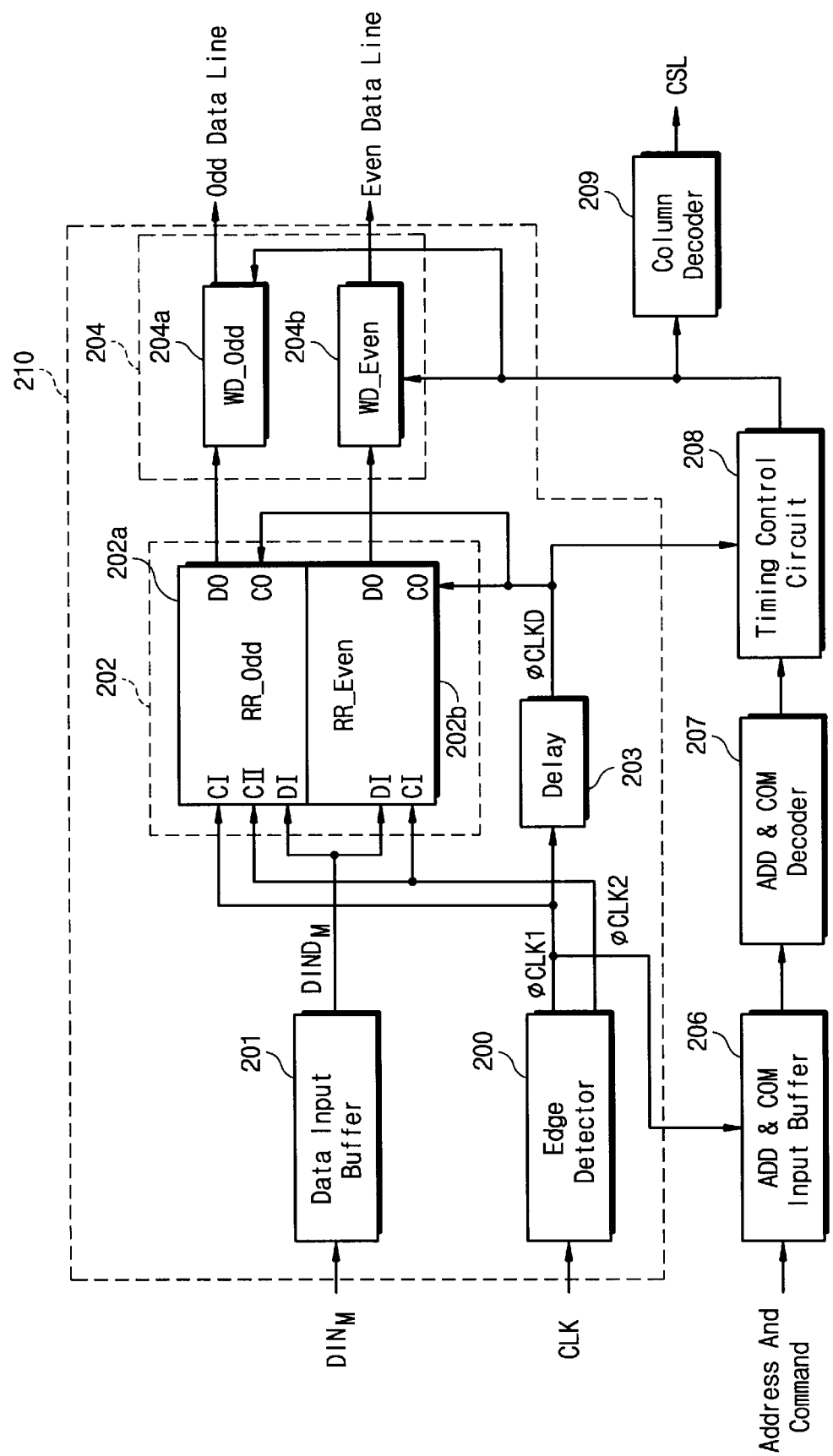
FIG. 4 is a block diagram of a synchronous semiconductor memory device according to a first embodiment of the present invention.

FIG. 4 is a block diagram of a synchronous semiconductor memory device according to a first embodiment of the present invention. Referring to FIG. 1, a data input circuit 210 has an edge detector 200, a data input buffer 201, a data register circuit 202, a delay circuit 203, and a write driver circuit 204. The data register circuit 202 is comprised of registers 202a and 202b and the write driver circuit 204 is comprised of registers 204a and 204b. The edge detector 200 generates a first internal clock signal $\phi CLK1$ when a rising edge of an external clock signal CLK is detected and generates a second internal clock signal $\phi CLK2$ when a falling edge of the external clock signal CLK is detected. The externally applied data string $DIND_M$ (where M is equal to 0, 2, ..., i) is provided to the data register circuit 202 through the data input buffer 201. The register 202a (RR_Odd) stores the odd-numbered data D1, D3, ... $D_{2N+1}$ (where N is an integer number) of the data string $DIND_M$ in synchronization with or responsive to the first and second internal clock signals $\phi CLK1$ and $\phi CLK2$. The first internal clock signal $\phi CLK1$ is provided to an input control terminal CI while the second internal clock signal $\phi CLK2$ is provided to an input terminal CII. The register 202b (RR_Even) stores the even-numbered data D2, D4, ... $D_{2N}$ (where N is an integer number) of the data string $DIND_M$ in synchronization with or responsive to the second internal clock signal $\phi CLK2$ from the edge detector 200. Delay circuit 203 delays the first or second internal clock signal $\phi CLK1$ or $\phi CLK2$, respectively, to generate a delayed clock signal $\phi CLKD$. The delayed clock signal $\phi CLKD$ of the delay circuit 203 is provided to output control terminals CO of the registers 202a and 202b as well as the timing circuit 208. The registers 202a and 202b output the odd-numbered and even-numbered data to the write drivers 204a and 204b, respectively, in synchronization with or responsive to the delayed clock signal $\phi CLKD$.

Figure 5:
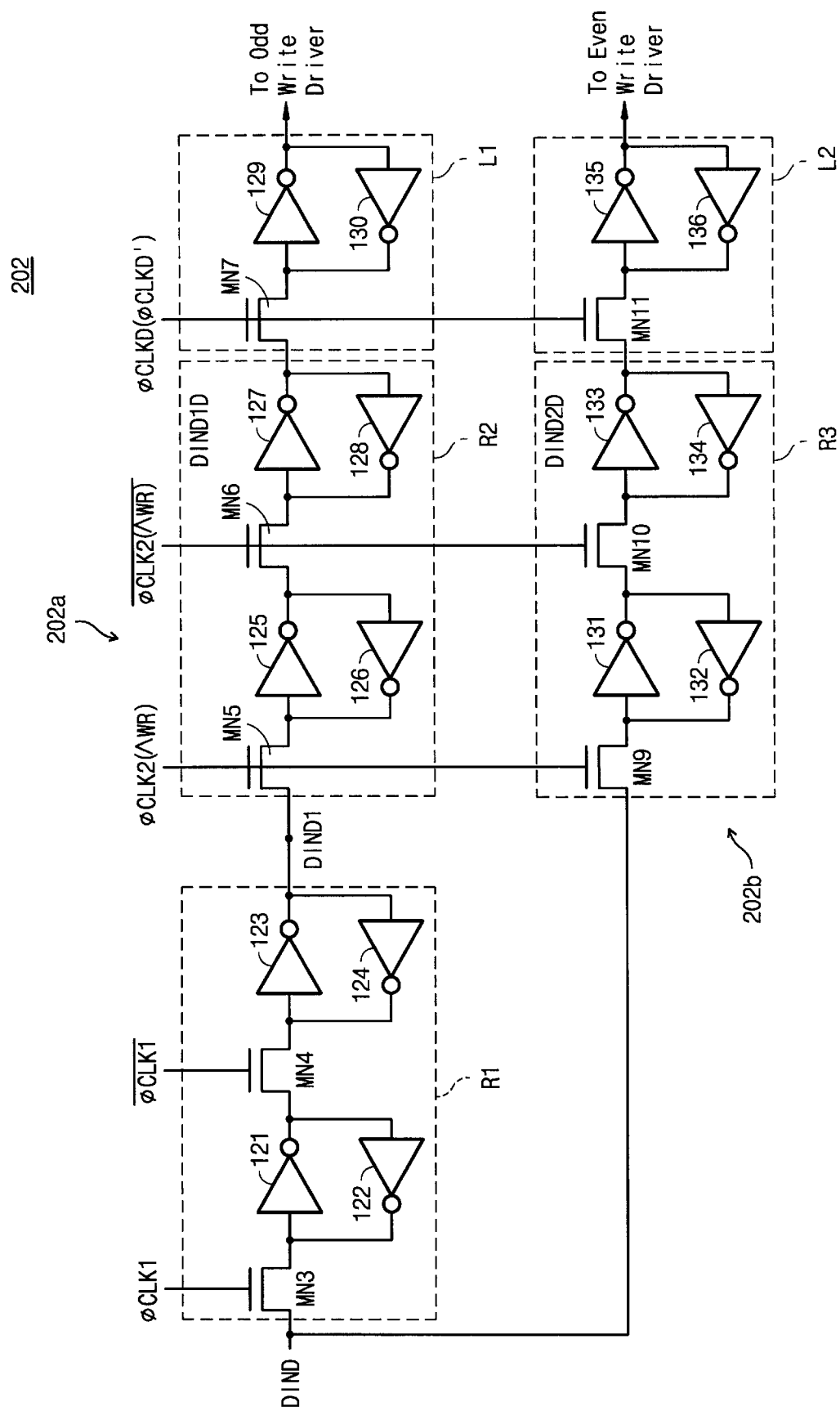
FIG. 5 is a detailed circuit diagram of a data register for the memory device shown in FIG. 4.
Figure 6:
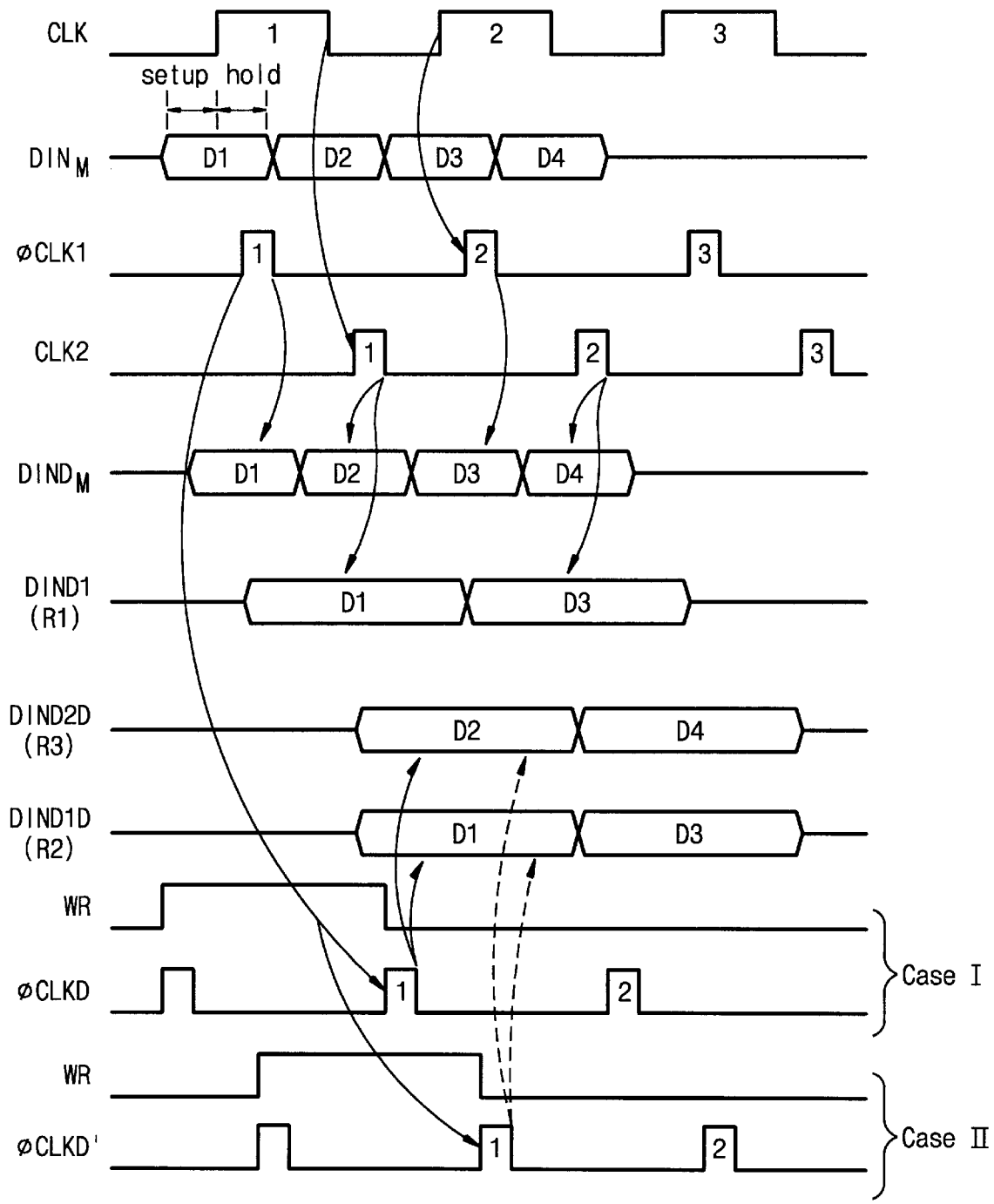
FIG. 6 is a timing diagram of a data writing operation for the memory device shown in FIG. 4.

FIG. 5 is a detailed circuit diagram of the data register circuit 202. FIG. 6 is a timing diagram of the data write operation of the memory device shown in FIG. 4. The data write operation of the memory device will be described below with reference to FIGS. 4 through 6. The edge detector 200 generates first and second internal clock signals $\phi CLK1$ and $\phi CLK2$, respectively, in synchronization with rising and falling edges of the external clock signal CLK. Data string $DIND_M$, meets the requirement of set-up time and hold time on the basis of the rising edge of the external clock signal CLK. For example, assume the data string $DIND_M$ (where M is equal to 1, 2, 3 and 4) is comprised of 4-bit data. It should be understood by those skilled in this art, however, that the data string $DIND_M$ might be comprised of more than four bit data.

As best shown in FIG. 5, the register 202a is comprised of unit storage cells R1 and R2 and latch L1. The storage cell R1 is comprised of CMOS inverters 121 to 124 and NMOS transistors MN3 and MN4. Inverters 121 and 122 and 123 and 124 are respectively cross-coupled. The second unit storage cell R2 is comprised of inverters 125 to 128 and NMOS transistors MN5 and MN6. Similarly, the second unit storage cell R2 has the same construction as the first unit storage cell R1. The latch L1 located between the storage cell R2 and the write driver 204a is comprised of NMOS transistor MN7 and CMOS inverters 129 and 130.

The register 202b is comprised of a unit storage cell R3 and a latch L2. The storage cell R3 is comprised of NMOS transistors MN9 and MN10 and CMOS inverters 131 to 134 and has the same construction as the first and second storage cells R1 or R2, respectively. The latch L2 is comprised of NMOS transistor MN11 and CMOS inverters 135 and 136 and has the same construction as the latch L1.

The storage cell R1 stores the odd-numbered data D1 and D3 of the data string $DIN_M$ in synchronization with the clock signals φCLK1 and $\overline{\phi CLK1}$. The third storage cell R3 stores the even-numbered data D2 and D4 in synchronization with the clock signals φCLK2 and $\overline{\phi CLK2}$. At the same time, the second storage cell R2 of the register 202a stores the odd-numbered data stored in the first storage cell R1 in synchronization with the clock signals φCLK2 and $\overline{\phi CLK2}$. As a result, the pair of odd-numbered data D1 and D3 and the pair of the even-numbered data D2 and D4 are arranged as shown in FIG. 6.

Subsequently, the odd-numbered data pair D1 and D3 and the even-numbered data pair D2 and D4 are provided to the write drivers 204a and 204b in synchronization with the delayed clock signal φCLKD. The delayed clock signal φCLKD is applied as one of clock signals φCLKD and φCLKD' having delay times different from each other, to the registers 202a and 202b according to a timing margin. Also, to prevent the continuous storage of invalid data in the data register circuit 202, it is preferable to use in the data register circuit 202 a signal φCLK2ΛWR and its complementary signal $\overline{\phi CLK2\_WR}$. Signal φCLK2ΛWR and its complementary signal $\overline{\phi CLK2\_WR}$ are produced by ANDing the signal WR and the clock signal φCLK2.

As shown in FIG. 4, the write drivers 204a and 204b are under the control of the timing control circuit 208. Write drivers 204a and 204b deliver the data pairs D1 and D3 and D2 and D4 to the corresponding data lines. The timing control circuit 208 for selecting a column corresponding to an address also activates the column decoder 209.

Second Embodiment

Figure 7:
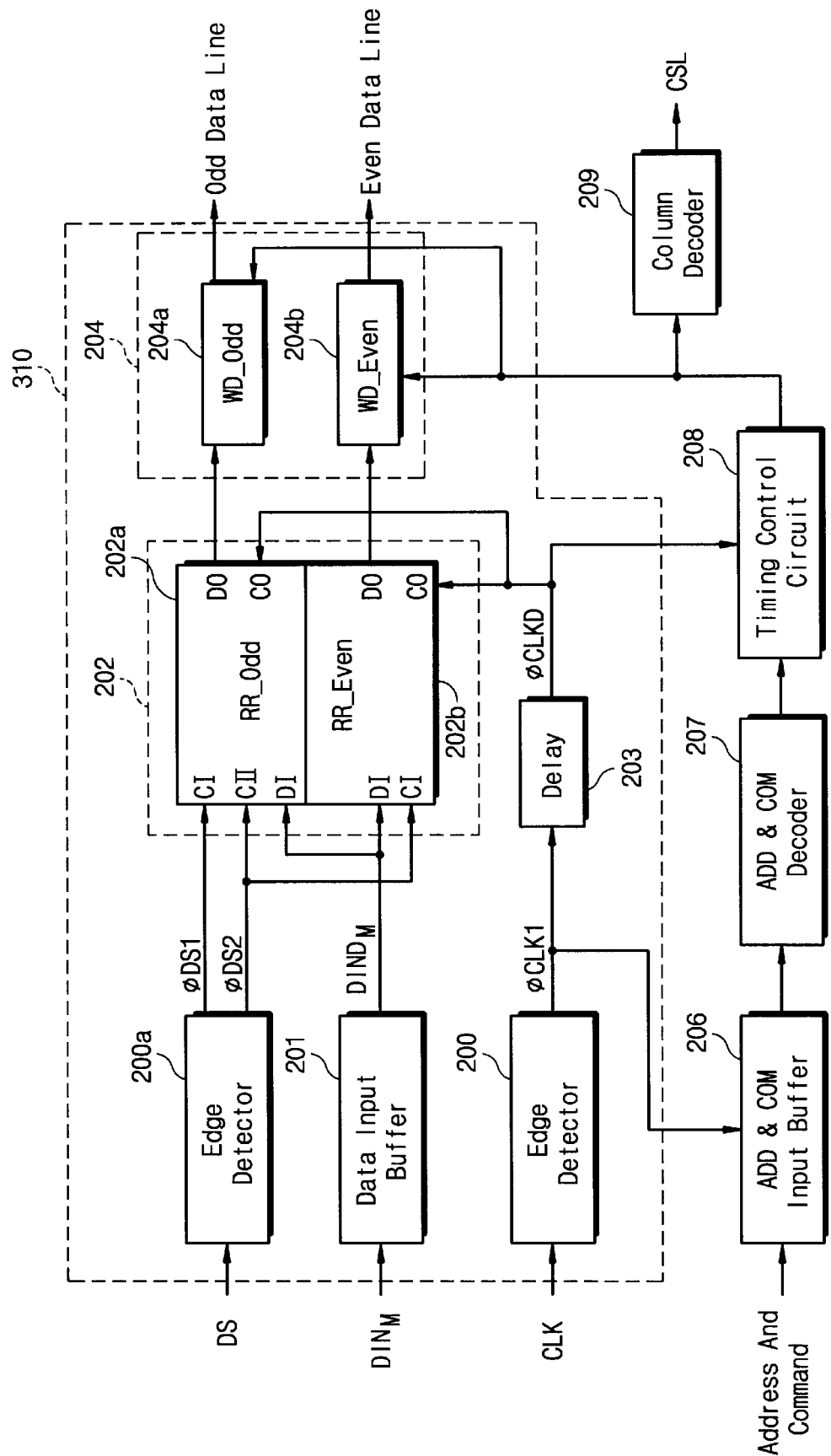
FIG. 7 is a block diagram of a synchronous semiconductor memory device according to a second embodiment of the present invention.

FIG. 7 is a block diagram of a synchronous semiconductor memory device according to a second embodiment of the present invention. In FIGS. 4 and 7, like components are designated with like reference numbers.

Referring to FIG. 7, the memory device of this embodiment receives an externally applied data strobe signal DS during a data write operation. The data input circuit 310 has the same construction as that of the data input circuit 210 shown in FIG. 4 (first embodiment) except that the circuit 310 further comprises an edge detector 200a. The edge detector 200a is included to detect an edge of the data strobe signal DS. The edge detector 200a generates first and second internal strobe signals φDS1 and φDS2 in synchronization with rising and falling edges of the data strobe signal DS, respectively. The signals φDS1 and φDS2 are provided to the input control terminals CI and CII, respectively, of the register 202a and to the input control terminal CI of register 202b. The first and second internal clock signals φCLK1 and φCLK2, respectively, output from edge detector 200 is provided to the delay circuit 203. The delay circuit 203 generates the delayed clock signal φCLKD by delaying the first internal clock signal φCLK1. The delayed clock signal φCLKD is provided to the output control terminals CO of the registers 202a and 202b as well as to the timing control circuit 208.

The externally applied data string $DIND_M$, (where M is equal to 0, 2, . . ., i) is provided 201 to the data register circuit 202 through the data input buffer. The register 202a stores odd-numbered data D1, D3, . . . $D_{2N+1}$ of the data string $DIND_M$ in synchronization with the first and second internal strobe signals φDS1 and φDS2, respectively, are applied through the input control terminals CI and CII, respectively. The register 202b stores even-numbered data D2, D4, . . . . D2N of the data string $DIND_M$ in turn in synchronization with the second internal strobe signal φDS2 from the edge detector 200. The registers 202a and 202b output the odd-numbered and even-numbered data to the write drivers 204a and 204b, respectively, in synchronization with a delayed clock signal φCLKD from the delay circuit 203.

Figure 8:
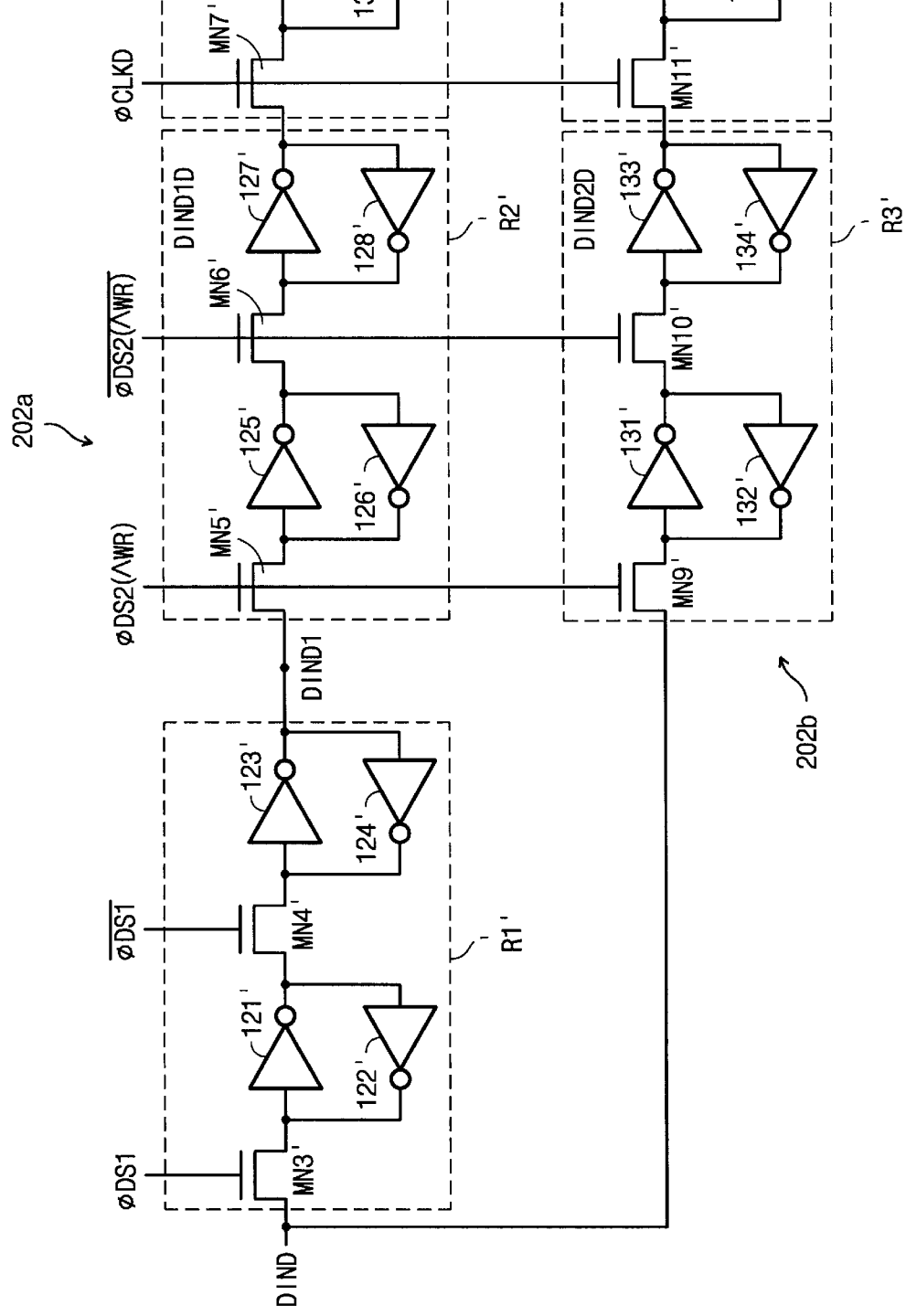
FIG. 8 is a detailed circuit diagram of a data register for the memory device shown in FIG. 7.

FIG. 8 is a detailed circuit diagram of the data register circuit 202. The data register circuit 202 of FIG. 8 has the same construction as that of FIG. 5 (first embodiment) except that it receives the first and second internal strobe signals φDS1 and φDS2. Referring to FIG. 8, the register 202a is comprised of unit storage cells R1' and R2' and latch L1'. The storage cell R1' is comprised of CMOS inverters 121' to 124' and NMOS transistors MN3' and MN4'. The storage cell R2' is comprised of inverters 125' to 128' and NMOS transistors MN5' and MN6'. As shown in this figure, the storage cell R1' has the same construction as the storage cell R2'. The latch L1' located between the storage cell R2' and the write driver 204a' is comprised of NMOS transistor MN7' and CMOS inverters 129' and 130'. The register 202b is comprised of a unit storage cell R3' and a latch L2'. The storage cell R3' is comprised of NMOS transistors MN9' and MN10' and CMOS inverters 131' to 134'. The latch L2' is comprised of NMOS transistor MN11' and CMOS inverters 135' and 136'.

Figure 9:
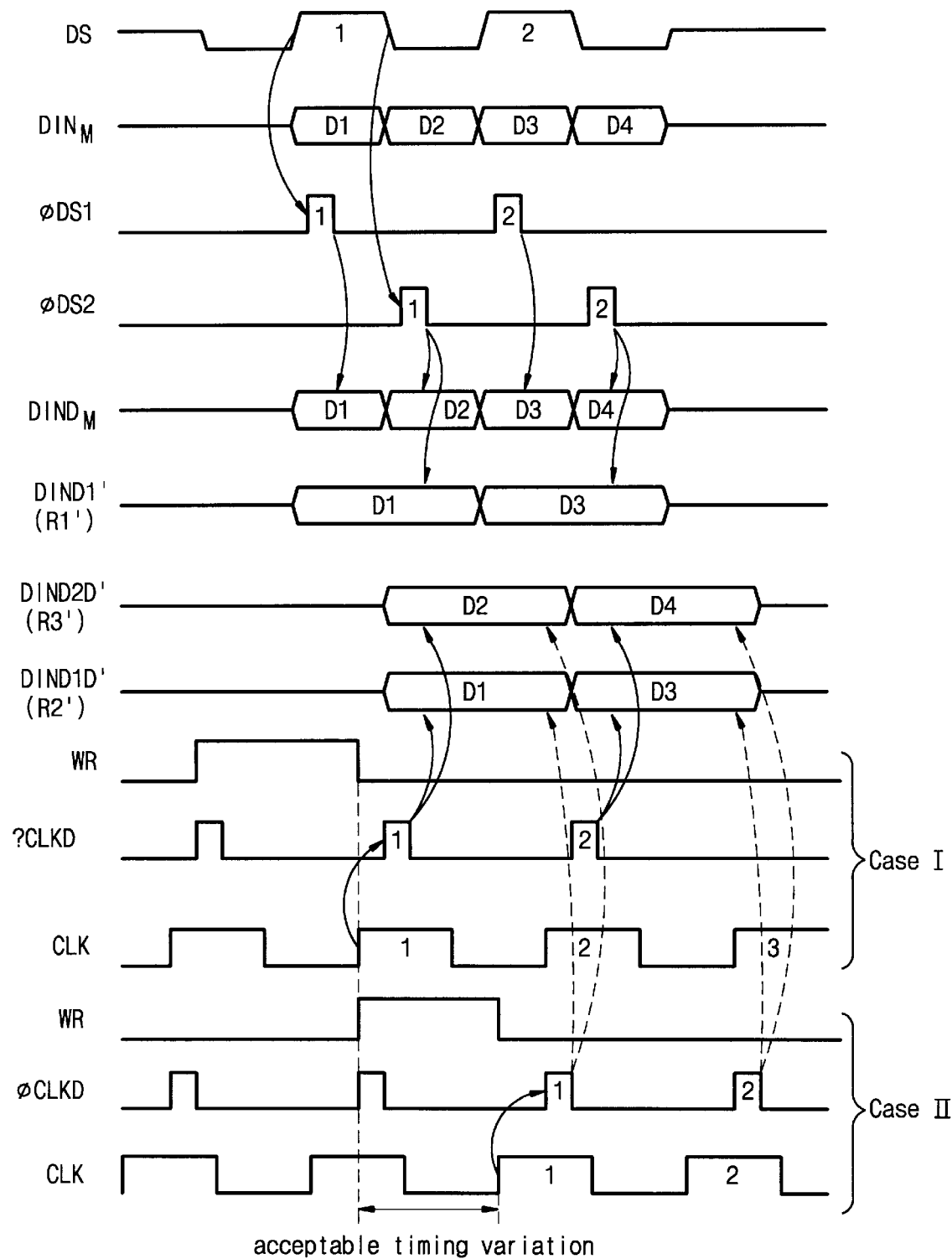
FIG. 9 is a timing diagram of a data writing operation for the memory device shown in FIG. 7.

FIG. 9 is a timing diagram of the data write operation for the memory device shown in FIG. 7. The data write operation of the memory device will be described below with reference to FIGS. 7 through 9. Let the data string $DIND_M$ have four bit data. The storage cell R1' stores the odd-numbered data D1 and D3 of the data string $DIND_M$ in synchronization with the internal data strobe signals φDS1 and $\overline{\phi DS1}$. The cell R3' stores the even-numbered data D2 and D4 in synchronization with clock signals φDS2 and $\overline{\phi DS2}$. At the same time, the storage cell R2' of the register 202a stores the odd-numbered data D1 stored in the storage cell R1' in synchronization with the clock signals φDS2 and $\overline{\phi DS2}$. Thus, the pair of the odd-numbered data D1 and D3 and the pair of the even-numbered data D2 and D4 are arranged as shown in FIG. 9.

Subsequently, the odd-numbered data pair D1 and D3 and the even-numbered data pair D2 and are provided to the write drivers 204a and 204b in synchronization with the clock signal φCLKD. The write drivers 204a and 204b are activated with the external clock signal CLK next to the write command WR.

In FIG. 9, Case I illustrates that the data reaches the register circuit 202 with the data strobe signals after the delayed clock signal φCLKD is generated. Case 11 illustrates that data reaches the register circuit 202 before the delayed clock signal φCLKD is generated.

A data set-up or hold window of approximately 3 nanoseconds is available in the first embodiment wherein the external clock signal is used to write, while that of at least one clock is available from the circuit of the second embodiment as can be seen from Cases I and II. Namely, a timing margin for data input synchronized with the external clock signal CLK is sufficiently assured. Similarly, to prevent the continuous storage of invalid data in the data register circuit 202, it is preferable to use a signal φDSΛWR and its complementary signal $\overline{\phi DS2\_WR}$ in the data register circuit 202 which may be produced by ANDing a signal WR and the clock signal φDS2.

As shown in FIG. 7, the write drivers 204a and 204b are under the control of the timing control circuit 208. Write drivers 204a and 204b deliver the data pairs D1 and D3 and D2 and D4 to the corresponding data lines. The timing control circuit 208 activates the column decoder 209 for selecting a column corresponding to an address.

Third Embodiment

Figure 10:
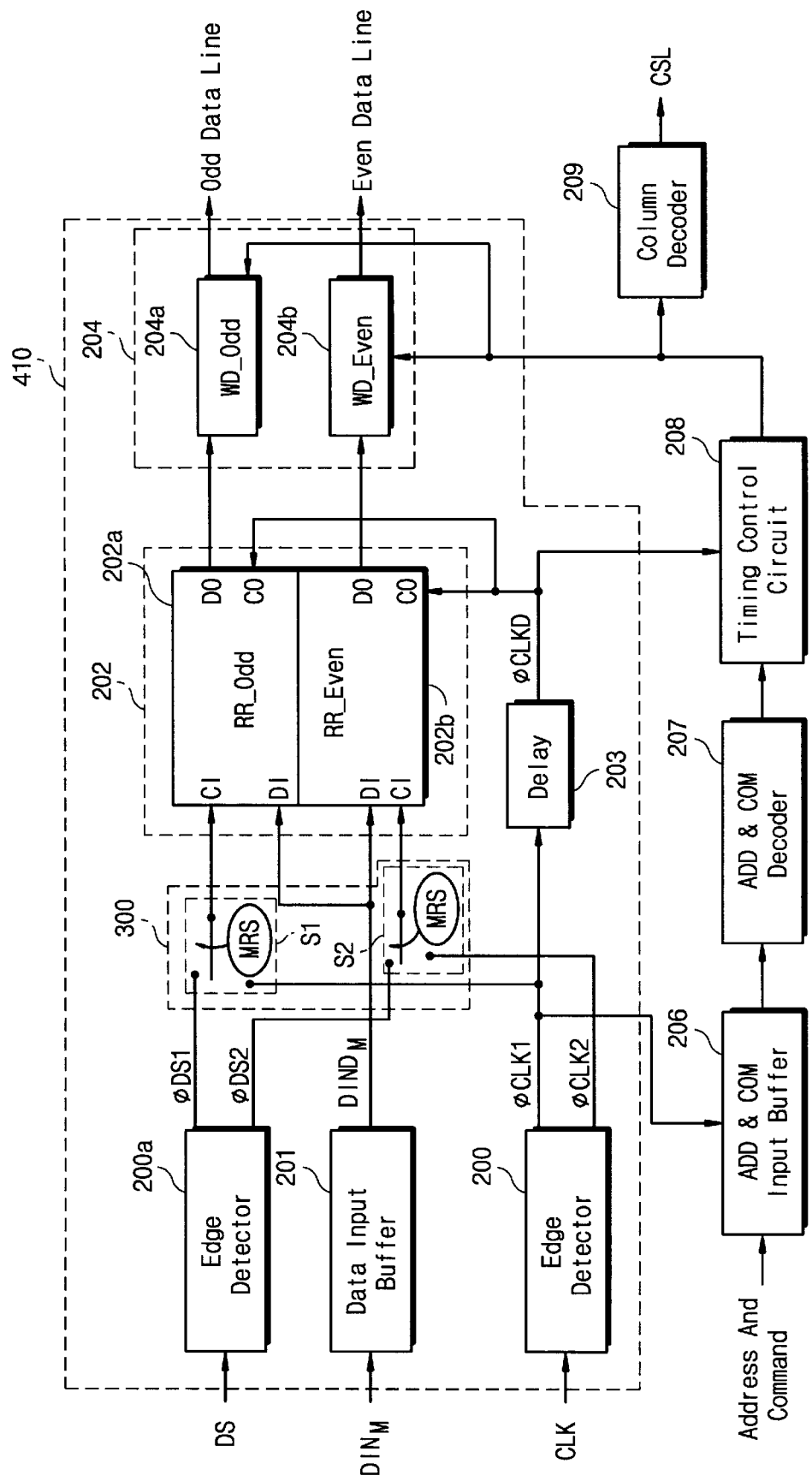
FIG. 10 is a block diagram of a synchronous semiconductor memory device according to a third embodiment of the present invention.

FIG. 10 shows a data input circuit 410 and peripheral circuits thereof for a synchronous semiconductor memory device according to a third embodiment of the present invention. In FIG. 10, the same components as those shown in FIGS. 4 and 7 are indicated by the same reference numbers.

Referring to FIG. 10, the memory device of this embodiment has two edge detectors 200 and 200a and a selection circuit 300. The edge detector 200 generates a first internal clock signal φCLK1 when a rising edge of the external clock signal CLK is detected and generates a second internal clock signal φCLK2 when a falling edge of the external clock signal is detected. The edge detector 202a generates first and second internal strobe signals φDS1 and φDS2 which are synchronized with the rising and falling edges, respectively, of an externally applied data strobe signal DS. The selection circuit 300 is controlled by a selection control signal MRS of the mode register (not shown) well-known in the art so that either the internal clock signal φCLK1 and φCLK2 or the strobe signals, φDS1 and φDS2 are selectively provided to the register circuit 202.

For example, when a selection control signal MRS having a logic '1' level is applied from the mode register, the selection circuit 300 provides the internal clock signals φCLK1 and φCLK2 to the data register circuit 202. In this case, operation of the data input circuit 410 is identical with the generation of the input circuit 210 shown in FIG. 4.

On the other hand, when a selection control signal MRS having a logic '0' level is applied, the selection circuit 300 provides the internal strobe signals φDS1 and φDS2 to the data register circuit 202. In this case, the operation of the data input circuit 410 is identical with the operation of the input circuit 310 shown in FIG. 7.

As described above, a synchronous semiconductor memory device according to the present invention has a data input circuit that allows a high speed writing operation by selectively using a clock signal or a data strobe signal. Also, where the data strobe signal is used to write data into a cell array of the memory device, the timing margin of data set-up and hold window is sufficiently assured.

What is claimed is:

1. A data input circuit for a synchronous semiconductor memory device having a memory cell array, comprising:
    a first edge detector for generating a first internal strobe signal and a second internal strobe signal responsive to an external data strobe signal;
    a second edge detector for generating a first internal clock signal and a second internal clock signal responsive to an external clock signal;
    a selector for selecting either the first and second internal strobe signals or the first and second internal clock signals in response to a selection control signal;
    a register circuit having first and second registers, the first register for storing odd-numbered data of an externally applied data string responsive to the selected signals and the second register for storing even-numbered data of the data string responsive to the selected signals;
    a delay circuit for generating a delayed clock signal by delaying one of the internal clock signals; and
    a data write driver having first and second write drivers, the first write driver for writing the odd-numbered data from the first register into the memory cell array responsive to the delayed clock signal and the second write driver for writing the even-numbered data from the second register into the memory cell array responsive to the delayed clock signal.

2. The data input circuit according to claim 1 wherein said selection control signal is a control signal generated in a mode register of the memory device.

3. The data input circuit according to claim 1 wherein the first and second strobe signals are generated responsive to a first and a second edge of the external data strobe signal, respectively.

4. The data input circuit according to claim 3 wherein the first and second internal clock signals are generated responsive to a first and a second edge of the external clock signal, respectively.

5. A data input circuit for a synchronous semiconductor memory device having a memory cell array, comprising:
    a first edge detector for generating a first internal strobe signal when a rising edge of an externally applied data strobe signal is detected, and generating a second internal strobe signal when a falling edge of the externally applied data strobe signal is detected;
    a second edge detector for generating a first internal clock signal when a rising edge of an externally applied clock signal is detected, and generating a second internal clock signal when a falling edge of the externally applied clock signal is detected;
    a selector for selecting either the first and second internal strobe signals or the first and second internal clock signals responsive to a selection control signal;
    a register circuit having first and second registers, the first register for storing odd-numbered data of an externally applied data string responsive to the selected signals and the second register for storing even-numbered data of the data string responsive to the selected signals;
    a delay circuit for generating a delayed clock signal by delaying one of the internal clock signals;
    a data write driver having first and second write drivers, the first write driver for writing the odd-numbered data from the first register into the memory cell array responsive to the delayed clock signal and the second driver for writing the even-numbered data from the second register into the memory cell array responsive to the delayed clock signal; and
    a data input buffer for temporarily storing the data string.

6. A data input circuit for a synchronous semiconductor memory device having a memory cell array, comprising:
    an edge detector for generating a first and a second internal clock signal responsive to an external clock signal;
    a register circuit having first and second registers, the first register for storing odd-numbered data of an externally applied data string responsive to the first internal clock signal and the second register for storing even-numbered data of the externally applied data string responsive to the second internal clock signal;
    a delay circuit for generating a delayed clock signal by delaying one of the internal clock signals; and
    a data write driver having first and second write drivers, the first write driver for writing the odd-numbered data from the first register into the memory cell array responsive to the delayed clock signal and the second write driver for writing the even-numbered data from the second register into the memory cell array responsive to the delayed clock signal.

7. The data input circuit according to claim 6 wherein the first and second internal clock signals are generated responsive to a first and a second edge of the external clock signal, respectively.

8. A method for writing data into a semiconductor memory device having a memory cell array, comprising:

receiving an external clock signal and an external data string;

generating a first and a second internal clock signal responsive to the external clock signal;

storing odd-numbered data from the external data string into a first register responsive to the first internal clock signal;

storing even data-numbered from the external data string into a second register responsive to the second internal clock signal;

delaying the first internal clock signal;

writing the odd-numbered data from the first register to the memory cell responsive to the delayed first internal clock signal; and writing the even-numbered data from the first register to the memory cell responsive to the delayed first internal clock signal.

9. A data input circuit for a synchronous semiconductor memory device having a memory cell array, comprising:

an edge detector for generating a first internal clock signal when a rising edge of an externally applied clock signal is detected and generating a second internal clock signal when a falling edge of the externally applied clock signal is detected;

a register circuit having first and second registers, the first register for storing an odd-numbered data of an externally applied data string responsive to the first and the second internal clock signals and the second register for storing an even-numbered data of the data string into the second register responsive to the second internal clock signal;

a delay circuit for generating a delayed clock signal by delaying one of the internal clock signals;

a data write driver having first and second write drivers, the first write driver for writing the odd-numbered data from the first register into the memory cell array responsive to the delayed clock signal and the second write driver for writing the even-numbered data from the second register into the memory cell array responsive to the delayed clock signal; and a data input buffer for temporarily storing the data string.

10. The method for writing data of claim 8 including buffering the external data string after receiving the data string.

11. A data input circuit for a synchronous semiconductor memory device having a memory cell array, comprising:

a first edge detector for generating a first internal strobe signal responsive to a first edge of an externally applied data strobe signal and generating a second internal strobe signal responsive to a second edge of the externally applied data strobe signal;

a register circuit having first and second registers, the first register for storing odd-numbered data of an externally applied data string responsive to the first or the second internal strobe signals and the second register for storing even-numbered data of the externally applied data string responsive to the second internal strobe signal;

a second edge detector for generating an internal clock signal responsive to an edge of an externally applied clock signal;

a delay circuit for generating a delayed clock signal by delaying the internal clock signal; and a data write driver having first and second write drivers, the first write driver for writing the odd-numbered data from the first register into the memory cell array responsive to the delayed clock signal and the second write driver for writing the even-numbered data from the second register into the memory cell array responsive to the delayed clock signal.

12. A data input circuit for a synchronous semiconductor memory device having a memory cell array, comprising:

a first edge detector for generating a first internal strobe signal responsive to a first edge of an externally applied data strobe signal and generating a second internal strobe signal responsive to a second edge of the externally applied data strobe signal;

a register circuit having first and second registers, the first register for storing odd-numbered data of an externally applied data string responsive to the first and the second internal strobe signals and the second register for storing even-numbered data of the externally applied data string responsive to the second internal strobe signal;

a second edge detector for generating an internal clock signal responsive to an edge of an externally applied clock signal;

a delay circuit for generating a delayed clock signal by delaying the internal clock signal; and a data write driver having first and second write drivers, the first write driver for writing the odd-numbered data from the first register into the memory cell array responsive to the delayed clock signal and the second write driver for writing the even-numbered data from the second register into the memory cell array responsive to the delayed clock signal.

13. A method for writing data into a semiconductor memory device having a memory cell array, comprising:

receiving an external clock signal and an external data string;

generating a first and a second internal clock signals responsive to the external clock signal;

storing odd-numbered data from the external data string into a first register responsive to the first and the second internal clock signals;

storing even data-numbered from the external data string into a second register responsive to the second internal clock signal;

delaying one of the internal clock signals;

writing the odd-numbered data from the first register to the memory cell array responsive to the delayed internal clock signal;

writing the even-numbered data from the first register to the memory cell array responsive to the delayed first internal clock signal; and buffering the external data string after receiving the data string.

14. The method for writing data of claim 13 including buffering the external data string.

15. The method for writing data of claim 8 including:

receiving an external strobe signal; and generating a first and a second internal data strobe signal responsive to the external data strobe signal;

wherein storing odd-numbered data from the external data string into the first register responsive to the first internal clock signal is replaced with storing odd-numbered data from the external data string into the first register responsive to the first data strobe signal; and wherein storing even data-numbered from the external data string into the second register responsive to the second internal clock signal is replaced with storing even data-numbered from the external data string into the second register responsive to the second internal data strobe signal.

16. The method for writing data of claim 14 including buffering the external data string.

* * * * *

UNITED STATES PATENT AND TRADEMARK OFFICE
CERTIFICATE OF CORRECTION

PATENT NO. : 6,078,546
DATED : June 20, 2000
INVENTOR(S) : Lee

It is certified that error appears in the above-identified patent and that said Letters Patent is hereby corrected as shown below:

<u>Title page,</u>
Item [57], ABSTRACT, should read as follows, -- A synchronous semiconductor device having a double data rate input circuit is provided. The data rate input circuit allows data to be written in a memory cell responsive to a clock signal and a data strobe signal. The input circuit stores a pair of data that is synchronized with either the clock signal or the data strobe signal thereby processing data at high speeds. Where the data strobe is used, the data setup and hold time margin is improved. --

<u>Column 6,</u>
Line 47, "Case 11" should read -- Case II --.

<u>Column 7, line 44, through Column 12,</u>
The claims should read as follows,
-- 1. A data input circuit for a synchronous semiconductor memory device having a memory cell array, comprising:
a first edge detector for generating a first internal strobe signals and a second internal strobe signal responsive to an external data strobe signal;
a second edge detector for generating a first internal clock signal and a second internal clock signal responsive to an external clock signal;
a selector for selecting either the first and second internal strobe signals or the first and second internal clock signals in response to a selection control signal;
a register circuit having first and second registers, the first register for storing odd-numbered data of an externally applied data string responsive to the selected signals and the second register for storing even-numbered data of the data string responsive to the selected signals;
a delay circuit for generating a delayed clock signal by delaying one of the internal clock signals; and
a data write driver having first and second write drivers, the first write driver for writing the odd-numbered data from the first register into the memory cell array responsive to the delayed clock signal and the second write driver for writing the even-numbered data from the second register into the memory cell array responsive to the delayed clock signal.

2. A data input circuit for a synchronous semiconductor memory device having a memory cell array, comprising:
a first edge detector for generating a first internal strobe signal when a rising edge of an externally applied data strobe signal is detected, and generating a second internal strobe signal when a falling edge of the externally applied data strobe signal is detected;

UNITED STATES PATENT AND TRADEMARK OFFICE
CERTIFICATE OF CORRECTION

| | | |
|---|---|---|
| PATENT NO. | : 6,078,546 | |
| DATED | : June 20, 2000 | |
| INVENTOR(S) | : Lee | |

It is certified that error appears in the above-identified patent and that said Letters Patent is hereby corrected as shown below:

a second edge detector for generating a first internal clock signal when a rising edge of an externally applied clock signal is detected, and generating a second internal clock signal when a falling edge of the externally applied clock signal is detected;

a selector for selecting either the first and second internal strobe signals or the first and second internal clock signals responsive to a selection control signal;

a register circuit having first and second registers, the first register for storing odd-numbered data of an externally applied data string responsive to the selected signals and the second register for storing even-numbered data of the data string responsive to the selected signals;

a delay circuit for generating a delayed clock signal by delaying one of the internal clock signals;

a data write driver having first and second write drivers, the first write driver for writing the odd-numbered data from the first register into the memory cell array responsive to the delayed clock signal and the second driver for writing the even-numbered data from the second register into the memory cell array responsive to the delayed clock signal; and a data input buffer for temporarily storing the data string.

3.    The data input circuit to claim 1 wherein said selection control signal is a control signal generated in a mode register of the memory device.

4.    The data input circuit for a synchronous semiconductor memory device having a memory cell array, comprising:

an edge detector for generating a first and a second internal clock signal responsive to an external clock signal;

a register circuit having first and second registers, the first register for storing odd-numbered data of an externally applied data string responsive to the first internal clock signal and the second register for storing an even-numbered data of the externally applied data string responsive to the second internal clock signal;

a delay circuit for generating a delayed clock signal by delaying one of the internal clock signals; and a data write driver having first and second write drivers, the first write driver for writing the odd-numbered data from the first register into the memory cell array responsive to the delayed clock signal and the second write driver for writing the even-numbered data from the second register into the memory cell array responsive to the delayed clock signal.

UNITED STATES PATENT AND TRADEMARK OFFICE
CERTIFICATE OF CORRECTION

PATENT NO.   : 6,078,546
DATED        : June 20, 2000
INVENTOR(S)  : Lee

It is certified that error appears in the above-identified patent and that said Letters Patent is hereby corrected as shown below:

5. A data input circuit for a synchronous semiconductor memory device having a memory cell array, comprising:

an edge detector for generating a first internal clock signal when a rising edge of an externally applied clock signal is detected and generating a second internal clock signal when a falling edge of the externally applied clock signal is detected;

a register circuit having first and second registers, the first register for storing an odd-numbered data of an externally applied data string responsive to the first and the second internal clock signals and the second register for storing an even-numbered data of the data string into the second register responsive to the second internal clock signal;

a delay circuit for generating a delayed clock signal by delaying one of the internal clock signals;

a data write driver having first and second write drivers, the first write driver for writing the odd-numbered data from the first register into the memory cell array responsive to the delayed clock signal and the second write driver for writing the even-numbered data from the second register into the memory cell array responsive to the delayed clock signal; and a data input buffer for temporarily storing the data string.

6. A data input circuit for a synchronous semiconductor memory device having a memory cell array, comprising:

a first edge detector for generating a first internal strobe signal responsive to a first edge of an externally applied data strobe signal and generating a second internal strobe signal responsive to a second edge of the externally applied data strobe signal;

a register circuit having first and second register, the first register for storing odd-numbered data of an externally applied data string responsive to the first or the second internal strobe signals and the second register for storing even-numbered data of the externally applied data string responsive to the second internal strobe signal;

a second edge detector for generating an internal clock signal responsive to an edge of an externally applied clock signal;

a delay circuit for generating a delayed clock signal by delaying the internal clock signal; and a data write driver having first and second write drivers, the first write driver for writing the odd-numbered data from the first register into the memory cell array responsive to the delayed clock signal and the second write driver for writing the even-numbered data from the second register into the memory cell array responsive to the delayed clock signal.

UNITED STATES PATENT AND TRADEMARK OFFICE
CERTIFICATE OF CORRECTION

PATENT NO.     : 6,078,546
DATED          : June 20, 2000
INVENTOR(S)    : Lee

It is certified that error appears in the above-identified patent and that said Letters Patent is hereby corrected as shown below:

7.    The data input circuit according to claim 1 wherein the first and second internal strobe signals are generated responsive to a first and a second edge of the external data strobe signal, respectively.

8.    The data input circuit according to claim 7 wherein the first and second internal clock signals are generated responsive to a first a second edge of the external clock signal, respectively.

9.    The data input circuit according to claim 4 wherein the first and second internal clock signals are generated responsive to a first and a second edge of the external clock signal, respectively.

10.    The data input circuit according to claim 4 wherein the delay circuit generates the delayed clock signal by delaying one of the first and the second internal clock signals.

11.    The data input circuit according to claim 5 wherein the delay circuit generates a delayed clock signal by delaying one of the first and the second internal clock signals.

12.    A data input circuit for a synchronous semiconductor memory device having a memory cell array, comprising:
    a first edge detector for generating a first internal strobe signal responsive to a first edge of an externally applied data strobe signal and generating a second internal strobe signal responsive to a second edge of the externally applied data strobe signal;
    a register circuit having first and second registers, the first register for storing odd–numbered data of an externally applied data string responsive to the first and the second internal strobe signals and the second register for storing even-numbered data of the externally applied data string responsive to the second internal strobe signal;
    a second edge detector for generating an internal clock signal responsive to an edge of an externally applied clock signal;
    a delay circuit for generating a delayed clock signal by delaying the internal clock signal; and
    a data write driver having first and second write drivers, the first write driver for writing the odd-numbered data from the first register into the memory cell array responsive to the delayed clock signal and the second write driver for writing the even-numbered data from the second register into the memory cell array responsive to the delayed clock signal.
    the delayed circuit generates a delayed clock signal by delaying one of the first and the second internal clock signals.

UNITED STATES PATENT AND TRADEMARK OFFICE
CERTIFICATE OF CORRECTION

PATENT NO.     : 6,078,546
DATED          : June 20, 2000
INVENTOR(S)    : Lee

It is certified that error appears in the above-identified patent and that said Letters Patent is hereby corrected as shown below:

13.    A method for writing data into a semiconductor memory device having a memory cell array, comprising:
        receiving an external clock signal and an external data string;
        generating a first and a second internal clock signals responsive to the external clock signal;
        storing odd-numbered data from the external data string into a first register responsive to the first and the second internal clock signals;
        storing even data-numbered from the external data string into a second register responsive to the second internal clock signal;
        delaying one of the internal clock signals;
        writing the odd-numbered data from the first register to the memory cell array responsive to the delayed internal clock signal;
        writing the even-numbered data from the first register to the memory cell array responsive to the delayed first internal clock signal; and
        buffering the external data string after receiving the data string.

14.    The method for writing data of claim 13 wherein generating the first and second internal clock signal includes generating the first and second internal clock signals responsive to a first and a second edge of the external clock signal, respectively.

15.    The method for writing data of claim 13 including:
        receiving an external data strobe signal;
        generating a first and a second internal data strobe signals responsive to the external data strobe signal;
        selecting either the first and second internal clock signals or the first and second internal data strobe signals responsive to a selection control signal;
        wherein delaying one of the internal clock signals is replaced with delaying the first internal clock signal;
        wherein storing odd-numbered data from the external data string into a first register responsive to the first internal clock signal is replaced with storing odd-numbered data form the external data string into a first register responsive to one of the selected signals; and
        wherein storing even-numbered data from the external data string into a second register responsive to the second internal clock signal is replaced with storing even-numbered data from the external data string into a second register responsive to another of the selected signals.

UNITED STATES PATENT AND TRADEMARK OFFICE
CERTIFICATE OF CORRECTION

PATENT NO. : 6,078,546
DATED : June 20, 2000
INVENTOR(S) : Lee

It is certified that error appears in the above-identified patent and that said Letters Patent is hereby corrected as shown below:

16. The method for writing data of claim 13 including:
receiving an external strobe signal; and
generating a first and a second internal data strobe signal responsive to the external data strobe signal;
wherein delaying one of the internal clock signals is replaced the first internal clock signal;
wherein storing odd-numbered data from the external data string into the first register responsive to the first and second internal clock signals is replaced with storing odd-numbered data from the external data string into the first register responsive to the first and second data strobe signals; and
wherein storing even-numbered data from the external data string into the second register responsive to the second internal clock signal is replaced with storing even data-numbered from the external data string into the second register responsive to the second internal data strobe signal. --

Signed and Sealed this

Thirtieth Day of July, 2002

*Attest:*

JAMES E. ROGAN
*Director of the United States Patent and Trademark Office*

*Attesting Officer*